United States Patent
Kotsuka et al.

[11] Patent Number: 5,897,692
[45] Date of Patent: Apr. 27, 1999

[54] ELECTROLESS PLATING SOLUTION

[75] Inventors: Kazunori Kotsuka, Nagoya; Koji Kondo, Toyohashi, both of Japan

[73] Assignee: Denso Corporation, Japan

[21] Appl. No.: 08/925,059

[22] Filed: Sep. 8, 1997

[30] Foreign Application Priority Data

Sep. 10, 1996 [JP] Japan .................... 8-262501

[51] Int. Cl.[6] .................... C23C 18/34
[52] U.S. Cl. .............. 106/1.23; 106/1.23; 106/1.25; 106/1.27
[58] Field of Search ............... 106/1.22, 1.25, 106/1.27, 1.23

[56] References Cited

U.S. PATENT DOCUMENTS

| T965,005 | 12/1977 | Leone et al. | 548/182 |
|---|---|---|---|
| 3,716,462 | 2/1973 | Jensen | 106/1.27 |
| 3,717,482 | 2/1973 | Gulla et al. | 106/1.27 |
| 4,080,207 | 3/1978 | Leone et al. | 430/217 |
| 4,303,443 | 12/1981 | Miyazawa et al. | 106/1.23 |
| 5,269,838 | 12/1993 | Inoue et al. | 106/1.22 |
| 5,753,304 | 5/1998 | Tung | 106/1.11 |

FOREIGN PATENT DOCUMENTS

| 53-3326 | 1/1978 | Japan . |
|---|---|---|
| 2-298290 | 12/1990 | Japan . |
| 2-301591 | 12/1990 | Japan . |
| 4-116175 | 4/1992 | Japan . |
| 4-157169 | 5/1992 | Japan . |
| 53-295557 | 11/1993 | Japan . |
| 6-136589 | 5/1994 | Japan . |
| 6-318771 | 11/1994 | Japan . |

OTHER PUBLICATIONS

Dialog abstract of JP02/301591, Dec. 1990.

*Primary Examiner*—Helene Klemanski
*Attorney, Agent, or Firm*—Pillsbury Madison & Sutro, LLP

[57] ABSTRACT

An electroless plating solution having high stability and capable of preventing the formation of nodules is disclosed. The electroless plating solution includes metal ions which includes nickel ions and copper and/or cobalt ions, a complexing agent containing a hydroxycarboxylic acid and a reducing agent and having a pH of at least 7, and an anionic surfactant. The electroless plating solution further includes iron ions provided by a source selected from potassium ferrocyanide and potassium ferricyanide. The completing agent is preferably used in a molar amount at least equal to that of the metal ions. The electroless plating solution is preferred to contain from 1 mg/L to 0.2 g/L of iron ions and from 10 ppm to 10 g/L of the anionic surfactant.

4 Claims, 7 Drawing Sheets

the auto-decomposition starting time of the electroless

ELECTROLESS PLATING SOLUTION

BACKGROUND OF THE INVENTION

1. Field of the Invention

The present invention relates to an electroless plating solution, particularly to a stabilized solution which forms no nodules and which is capable of forming a plating film having a smooth surface.

2. Description of the Related Art

In forming a plating film on a substrate, it is possible to use an electroless plating method which deposits metal thereon by chemical reduction.

An electroless plating method is a method which, in general, deposits a metal plating film continuously in an electroless plating solution containing a metal salt and a reducing agent by a chemical reaction taking place among these substances. The electroless plating solution is either acidic or alkaline. For example, as disclosed in Japanese Unexamined Patent Publication (Kokai) No. 4-116175, there is an electroless plating solution containing nickel(II) sulfate, hypophosphorous acid as a reducing agent and citric acid as a complexing agent.

The great advantages of an electroless plating method are that a conductive metal coating can be formed on a suitably pretreated nonconductor, and that a plating film having a uniform thickness can be formed on a substrate having any shape. Accordingly, electroless plating is a technology which has heretofore been widely utilized for decoration, rust prevention, magnetic discs, pattern formation on a printed board, and the like.

Specifically, the electroless plating method has been used, for example, for the ground plating of a wiring pattern in the method for producing printed boards by the additive procedure.

That is, as shown in FIG. 11, a via hole 90 is provided in a substrate 91. A plating resist 92 is then formed in a portion of the surface of the substrate 91 where a pattern is not formed.

Electroless plating is subsequently conducted to form ground plating 931 in pattern-formed portions and in the interior of the via hole, and then electroplating is conducted to form thick copper plating 932. A wiring pattern 93 consisting of the ground plating 931 and the thick copper plating 932 and via hole plating 930 are thus formed.

An electroless copper-nickel plating as a ground plating for forming a printed board enhances the bonding strength between the substrate 91 and the thick copper plating 932 as disclosed, for example, in Japanese Unexamined Patent Publication (Kokai) No. 6-318771.

However, since a metal salt and a reducing agent are always in a reactive state in the electroless plating solution, the electroless plating solution is thermodynamically unstable. Ensuring the stability of the electroless plating solution is, therefore, the most important problem.

Accordingly, various stabilizers containing metal ions such as, for example, lead ions have heretofore been proposed. Further, Japanese Unexamined Patent Publication (Kokai) No. 4-116175 proposes a stabilizer containing an ammonium salt, and Japanese Unexamined Patent Publication (Kokai) No. 4-157169 proposes a stabilizer containing a ferrocyanide and a sulfide.

However, the use of lead is not preferred from the standpoint of environmental conservation. Moreover, it cannot be concluded that any of the prior technologies has fully achieved stabilization of the electroless plating solution.

Furthermore, an unstabilized electroless plating solution causes various problems during the formation of the wiring pattern. That is, since the wiring pattern 93 is required to be made fine, the widths of the pattern and the gaps among patterns have been made narrow. Accordingly, extraordinary depositions in the narrow gaps among lines must be avoided. The extraordinary depositions are termed nodules, and cause short circuits. The applicants believe that the nodules are formed by the decomposition reaction of the electroless plating solution which takes place when the concentration of oxygen playing the role of a stabilizer in the solution almost reaches zero near the plating reaction sites.

When nodules are formed in the ground plating 931 and are then coated with the thick copper plating 932, the copper plating also follows the nodules to become likely to cause short circuits between the lines.

However, the electroless copper-nickel plating method disclosed in Japanese Unexamined Patent Publication (Kokai) No. 6-318771 sometimes produces nodules on the ground plating when a wiring pattern having a line width as narrow as up to 100 $\mu$m is formed.

In view of the problems as mentioned above, the present invention is intended to provide an electroless plating solution capable of ensuring its stability and of preventing the formation of the nodules.

SUMMARY OF THE INVENTION

The present invention provides an electroless plating solution comprising metal ions which comprise nickel ions, and copper and/or cobalt ions, a complexing agent containing a hydroxycarboxylic acid and a reducing agent, and having a pH of at least 7, the electroless plating solution being characterized by comprising iron ions and an anionic surfactant.

DESCRIPTION OF THE PREFERRED EMBODIMENT

Figure 1:
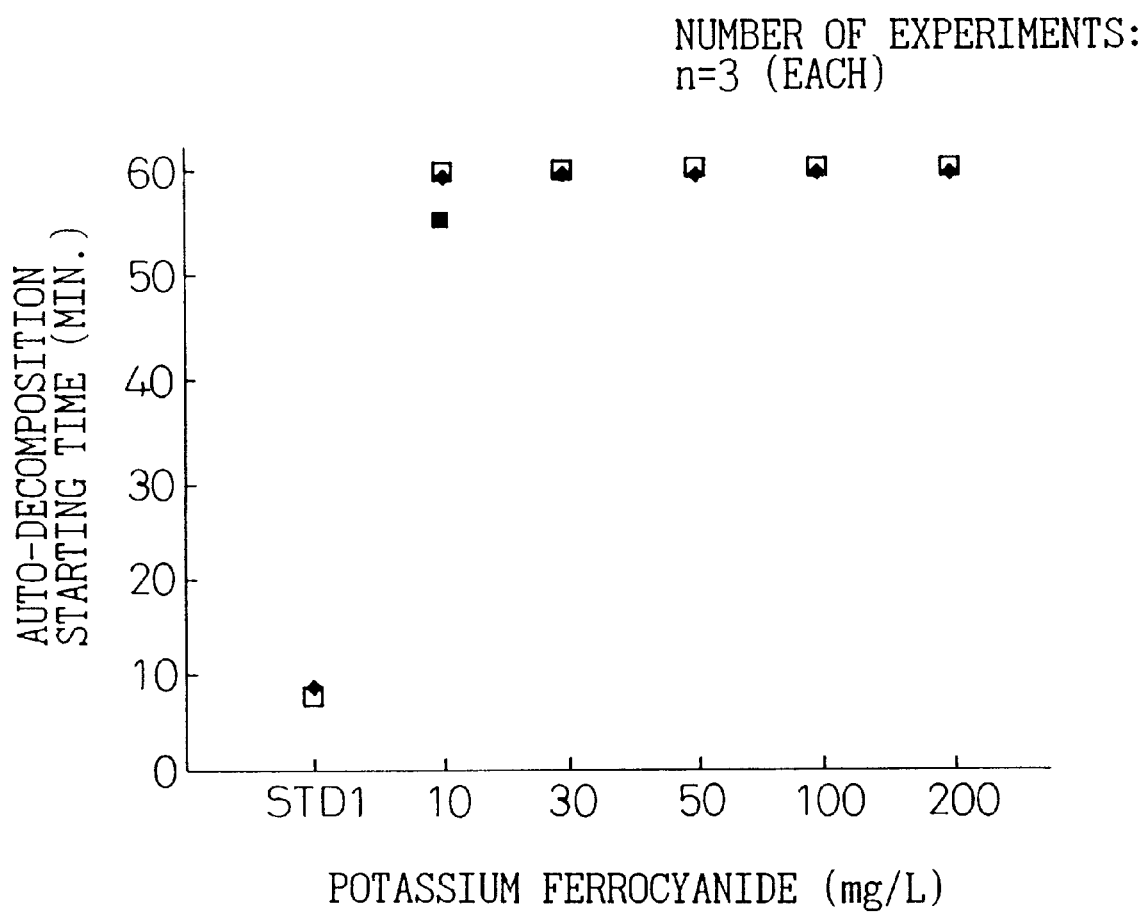
FIG. 1 is a graph showing the relationship between a concentration of potassium ferrocyanide and an auto-decomposition starting time of an electroless plating solution in Example 1.

In the present invention, the electroless plating solution contains iron ions. Addition of iron ions can improve the stability of the electroless plating solution and can inhibit the formation of the nodules.

Moreover, since the electroless plating solution of the present invention contains a complexing agent containing a hydroxycarboxylic acid and has a pH of at least 7, the effect of stabilizing the plating solution by the iron ions can be further achieved effectively. On the other hand, when the electroless plating solution has a pH of less than 7, there arises a problem that the hydroxycarboxylic acid precipitates and does not form complex ions with nickel or other metal ions.

Furthermore, in the present invention, an anionic surfactant as well as iron ions is added. As a result, a plating film having a smooth surface can be formed.

The iron ions are preferred to have a valence of 2 or 3. In this case, the stability of the electroless plating solution can further be improved. Examples of sources of the iron ions are potassium ferrocyanide, potassium ferricyanide, iron(II) chloride, iron(III) chloride, iron(II) sulfate, iron(III) sulfate and ammonium iron(III) sulfate. Among these, the iron ion source is preferred to be potassium ferrocyanide ($K_4[Fe(CN)_6]$) or potassium ferricyanide ($K_3[Fe(CN)_6]$). Iron ions having a valence of 2 or 3 can thus be easily added to the electroless plating solution.

The iron ions are preferably contained in the electroless plating solution in an amount of 1 mg/L to 0.2 g per liter on the basis of iron metal. The stability of the electroless plating solution can thus be enhanced further. When the iron ions are contained in an amount of less than 1 mg/L, the electroless plating solution may tend to decompose. Conversely, when they are contained in an amount exceeding 0.2 g/L, the iron ions themselves may become unstabilized.

Examples of the complexing agent are citric acid, tartaric acid, malic acid, glucoheptonic acid, malonic acid and salts thereof.

The molar amount of the complexing agent is preferably at least equal to that of the metal ions, more preferably at least equal to and not more than 10 mole times of that of the metal ions. The complex ions with the metal ions can thus be stabilized.

Examples of the reducing agent are sodium hypophosphite, formalin, hydrazine, dibutylamine borane, dimethylamine borane and boron hydride salts. These reducing agents are preferably contained in the electrodes plating solution in an amount of 0.05 to 1 mole per liter, more preferably in an amount of 0.05 to 0.5 mole per liter.

Examples of the anionic surfactant are Fluorad FC-95 (manufactured by 3M Co., US), sodium dodecyl sulfonate, sodium lauryl sulfate, sodium laurate and sodium stearate.

The anionic surfactant is preferably contained in the electroless plating solution in an amount of 10 mg/L to 20 g per liter. In this case, the smoothness of the plating film surface can be further improved. When it is contained in an amount of less than 10 mg/L, the surface of the plating film may be roughened. Conversely, when it is contained in an amount exceeding 20 g/L, the reactivity may be lowered and the plating film may not be formed.

EXAMPLE 1

An example of the electroless plating solution according to the present invention will be explained by making reference to FIGS. 1 and 2.

As shown in Table 1, the electroless plating solution of the present example contained 25 g/L of nickel(II) sulfate, 1.25 g/L of copper(II) sulfate, 42 g/L of disodium citrate as a complexing agent and 21 g/L of sodium hypophosphite as a reducing agent, and had a pH of 10.

TABLE 1

| Fundamental Composition (STD1) and Test Conditions | |
|---|---|
| Disodium citrate: | 42 g/L |
| Nickel (II) sulfate: | 25 g/L |
| Copper (II) sulfate: | 1.25 g/L |
| Sodium hypophosphite: | 21 g/L |
| FC-95 (anionic surfactant): | 0.1 g/L |
| pH: | 10 |
| Bath temperature: | 60° C. |

Moreover, the electroless plating solution contained iron ions and an anionic surfactant.

The anionic surfactant was Florinate FC-95 (manufactured by 3M Co.), and used in an amount of 0.1 g/L. The iron ion source was potassium ferrocyanide ($K_4[Fe(CN)_6]$), and the addition amount was 10, 30, 50, 100 or 200 mg/L.

In addition, an electroless plating solution to which only potassium ferrocyanide was not added (STD1) was prepared for comparison.

The stability of the electroless plating solutions were evaluated.

The electroless plating solution auto-decomposes when the oxygen concentration is lowered. The auto-decomposed electroless solution then produces nodules, which are extraordinary depositions, when the solution forms an electroless plating film. Nodules are, therefore, thought to be produced by an auto-decomposition reaction of the electroless plating solution which reaction takes place when the oxygen concentration near plating reaction sites in the electroless plating solution almost reaches zero. Accordingly, the stability of the electroless plating solution is thought to be evaluated by the time at which the auto-decomposition takes place when the oxygen concentration therein is lowered.

The stability of the electroless plating solution was measured as described below based on such estimation.

That is, electroless plating solutions having concentrations of potassium ferrocyanide different from each other were heated to 60° C., and nitrogen was introduced into each of the plating solutions in an amount of 2N (0° C., 1 atm) L/min.

When nickel starts to deposit in the electroless plating solution, the start of deposition is defined as the start of the auto-decomposition reaction of the electroless plating solution, and the time is recorded. The measurements were made three times.

Figure 2:
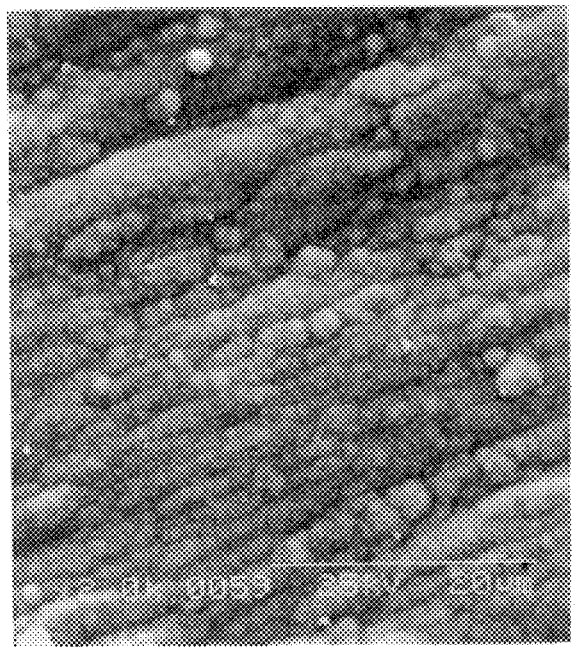
FIG. 2 is a photograph, which was prepared by a scanning electron microscope, of the surface of an electroless plating film formed from the electroless plating solution containing potassium ferrocyanide in Example 1.

The auto-decomposition starting time of each electroless plating solution is shown in FIG. 1.

It can be seen from FIG. 1 that an addition of at least 10 mg/L of potassium ferrocyanide stabilizes each electroless plating solution without auto-decomposition for at least one hour. On the other hand, when potassium ferrocyanide is not added (STD1), the electroless plating solution starts to auto-decompose in a time as short as less than 10 minutes.

It can be seen, from what has been described above, that the addition of potassium ferrocyanide stabilizes the electroless plating solution, and inhibits formation of nodules.

An electroless plating film was subsequently formed using the electroless plating solution prepared by adding 30 mg/L of potassium ferrocyanide, as shown in Table 2. The surface of the electroless plating film was observed by a SEM (scanning electron microscope). As a result, it is evident from the SEM photograph shown in FIG. 2 that the surface was smooth.

TABLE 2

Composition and Plating Conditions

| | |
|---|---|
| Disodium citrate: | 42 g/L |
| Nickel sulfate: | 25 g/L |
| Copper sulfate: | 1.25 g/L |
| Sodium hypophosphite: | 21 g/L |
| Potassium ferrocyanide: | 30 mg/L |
| FC-95 (anionic surfactant): | 0.1 g/L |
| pH: | 10 |
| Bath temperature: | 60° C. |
| Plating time: | one hour |

On the other hand, the surface of an electroless plating film was similarly observed using a SEM photograph for a case where no potassium ferrocyanide was added (STD1). As a result, the surface of the electroless plating film was as smooth as the one obtained above when potassium ferrocyanide was added.

It can be seen from what is described above that addition of potassium ferrocyanide significantly improves the stability of the electroless plating solution and that the surface of the electroless plating film is as smooth as the one obtained when no potassium ferrocyanide is added.

Furthermore, a wiring pattern was formed using the electroless plating solution of the present example. Consequently, even when the wiring pattern had a line width as narrow as about 100 $\mu$m, nodules were not produced, and the plating film surface could be made smooth.

EXAMPLE 2

In the present example, the procedure of Example 1 was repeated except that potassium ferricyanide ($K_3[Fe(CN)_6]$, iron(II) chloride ($FeCl_2$), iron(III) chloride ($FeCl_3$) or ammonium iron(III) sulfate was added as an iron source in place of potassium ferrocyanide in Example 1.

In the present example, each of the electroless plating solutions was stabilized without producing nodules, and a smooth electroless plating film could be formed, in the same manner as in Example 1.

EXAMPLE 3

The procedure of Example 1 was repeated except that sodium dodecyl sulfonate, sodium stearate, sodium laurate or sodium lauryl sulfate was used in place of Florinate FC-95 as an anionic surfactant in Example 1.

Also in the present example, the effect of stabilizing the electroless plating solution and the surface smoothness of the electroless plating film were obtained in the same manner as in Example 1.

EXAMPLE 4

In the present example, an electroless plating solution was prepared by changing the components of the electroless plating solution in Example 1.

Sodium boron hydride, hydrazine or dibutylamine borane was used as a reducing agent in place of sodium hypophosphite in Example 1.

Rochelle salt or malic acid was used as a complexing agent in place of disodium citrate in Example 1.

Nickel(II) chloride was used as a nickel ion source in place of nickel sulfate in Example 1.

Copper(II) chloride or copper(II) hydroxide was used as a copper ion source in place of copper(II) sulfate in Example 1.

Moreover, cobalt ions were used in place of or together with the copper ions mentioned above. Cobalt(II) chloride or cobalt gluconate was used as a cobalt ion source.

Potassium ferricyanide and Florinate FC-95 were used as an iron ion source and an anionic surfactant, respectively in the same manner as in Example 1.

In each case of the present example, the effect of stabilizing the electroless plating solution and the surface smoothness of the electroless plating film were obtained in the same manner as in Example 1.

Comparative Example 1

In the present comparative example, a nonionic surfactant was added in place of the anionic surfactant in the electroless plating solution of Example 1.

A polyethylene glycol (PEG 1000) was used as the nonionic surfactant. The nonionic surfactant was added in an amount of 0.1 g/L.

The other procedures and conditions were the same as in Example 1.

The auto-decomposition starting time of the electroless plating solution was measured in the same manner as in Example 1 in the present comparative example. As a result, the auto-decomposition was found not to start even one hour after starting the measurement. Accordingly, the electroless plating solution of the present comparative example proved to be excellent in stability.

Figure 3:
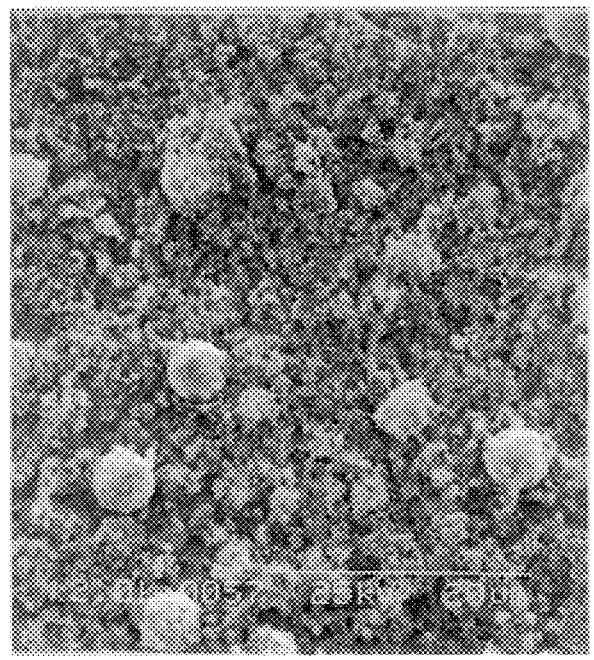
FIG. 3 is a photograph, which was prepared by a scanning electron microscope, of the surface of an electroless plating film formed from the electroless plating solution containing a nonionic surfactant in Comparative Example 1.

Next, an electroless plating film was formed using the electroless plating solution shown in Table 3. The surface of the electroless plating film was observed by a SEM to show that the surface was roughened as shown in FIG. 3. The roughened surface of the electroless plating film could also be visually observed.

TABLE 3

Composition and Plating Conditions

| | |
|---|---|
| Disodium citrate: | 42 g/L |
| Nickel (II) sulfate: | 25 g/L |
| Copper (II) sulfate: | 1.25 g/L |
| Sodium hypophosphite: | 21 g/L |
| Potassium ferrocyanide: | 30 mg/L |
| PEG 1000 (nonionic surfactant): | 0.1 g/L |
| pH: | 10 |
| Bath temperature: | 60° C. |
| Plating time: | one hour |

Comparative Example 2

The procedure of Comparative Example 1 was repeated except that the electroless plating solution was prepared without adding potassium ferrocyanide.

The auto-decomposition starting time of the electroless plating solution was measured in the same manner as in Example 1 in the present comparative example to find that the auto-decomposition started in a time as short as less than 10 minutes. It can be seen from the results that the electroless plating solution of the present comparative example was poor in stability.

Figure 4:
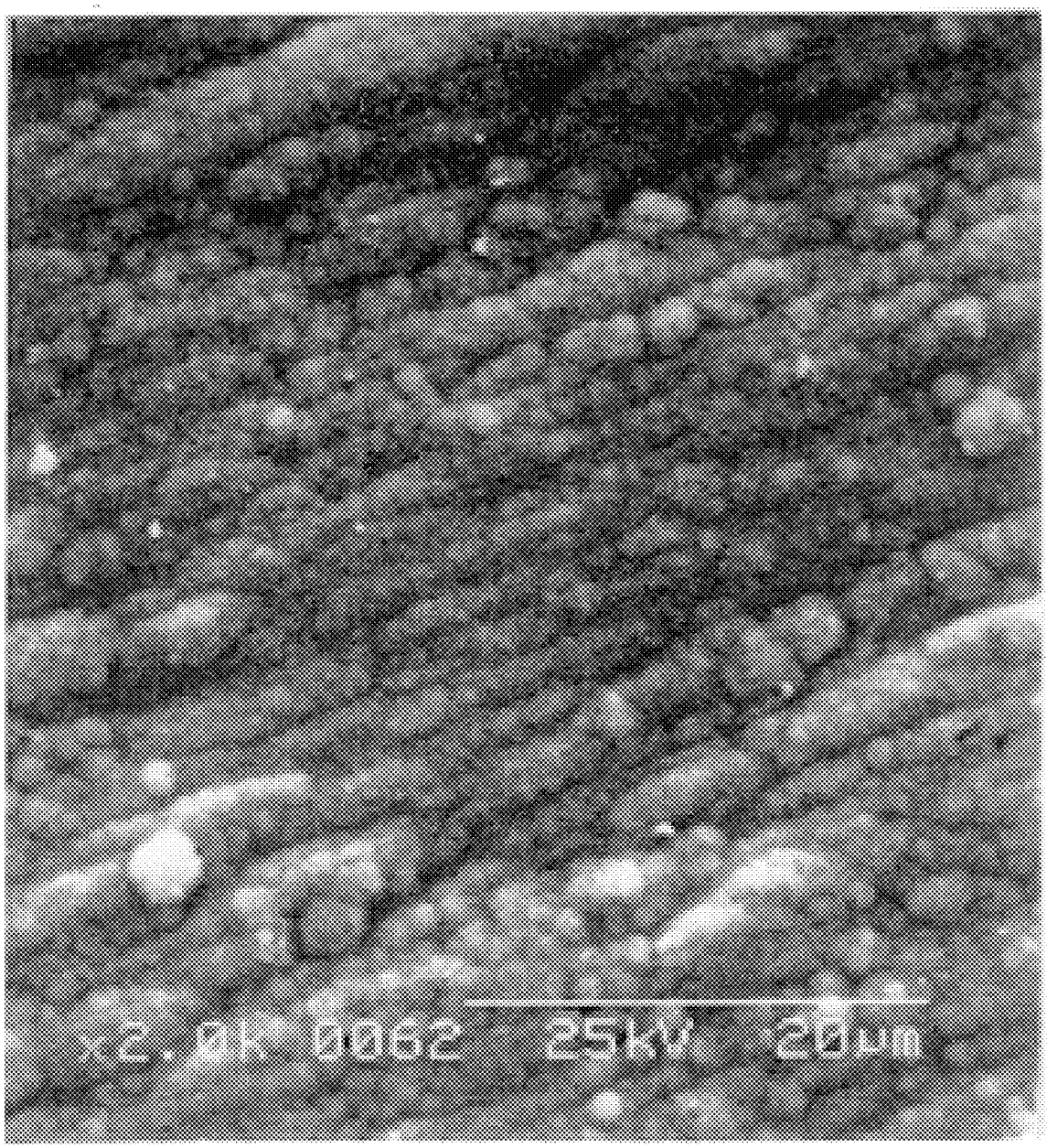
FIG. 4 is a photograph, which was prepared by a scanning electron microscope, of the surface of an electroless plating film formed from the electroless plating solution containing no potassium ferrocyanide and a nonionic surfactant in Comparative Example 2.

An electroless plating film was then formed using the electroless plating solution, as shown in Table 4. The surface of the electroless plating film was observed by a SEM to find that the surface of the electroplating film was smooth as shown in FIG. 4.

TABLE 4

Composition and Plating Conditions

| | |
|---|---|
| Disodium citrate: | 42 g/L |
| Nickel (II) sulfate: | 25 g/L |
| Copper (II) sulfate: | 1.25 g/L |
| Sodium hypophosphite: | 21 g/L |
| PEG 1000 (nonionic surfactant): | 0.1 g/L |
| pH: | 10 |
| Bath temperature: | 60° C. |
| Plating time: | one hour |

It can be seen from comparison of Comparative Example 2 to Comparative Example 1 (comparison of FIG. 4 to FIG. 3) that although the coexistence of the nonionic surfactant and potassium ferrocyanide stabilizes the electroless plating solution, the surface of the electroless plating film is roughened. The reason appears to be as described below. Since it is highly possible that the nonionic surfactant has poor compatibility with iron ions, potassium ferrocyanide negates the effect of the surfactant of smoothing the electroless plating film surface.

Comparative Example 3

The present comparative example differs from Example 1 in that bipyridyl was added in place of adding the anionic surfactant and potassium ferrocyanide.

That is, an electroless plating solution was prepared by adding 20, 60, 100 or 200 mg/L of bipyridyl to the electroless solution in Example 1 without the anionic surfactant and potassium ferrocyanide (STD2).

Bipyridyl has heretofore been used as a stabilizing agent of electroless plating solutions.

The stability of the electroless plating solution was evaluated in the same manner as in Example 1. The results thus obtained are shown in FIG. 5.

Figure 5:
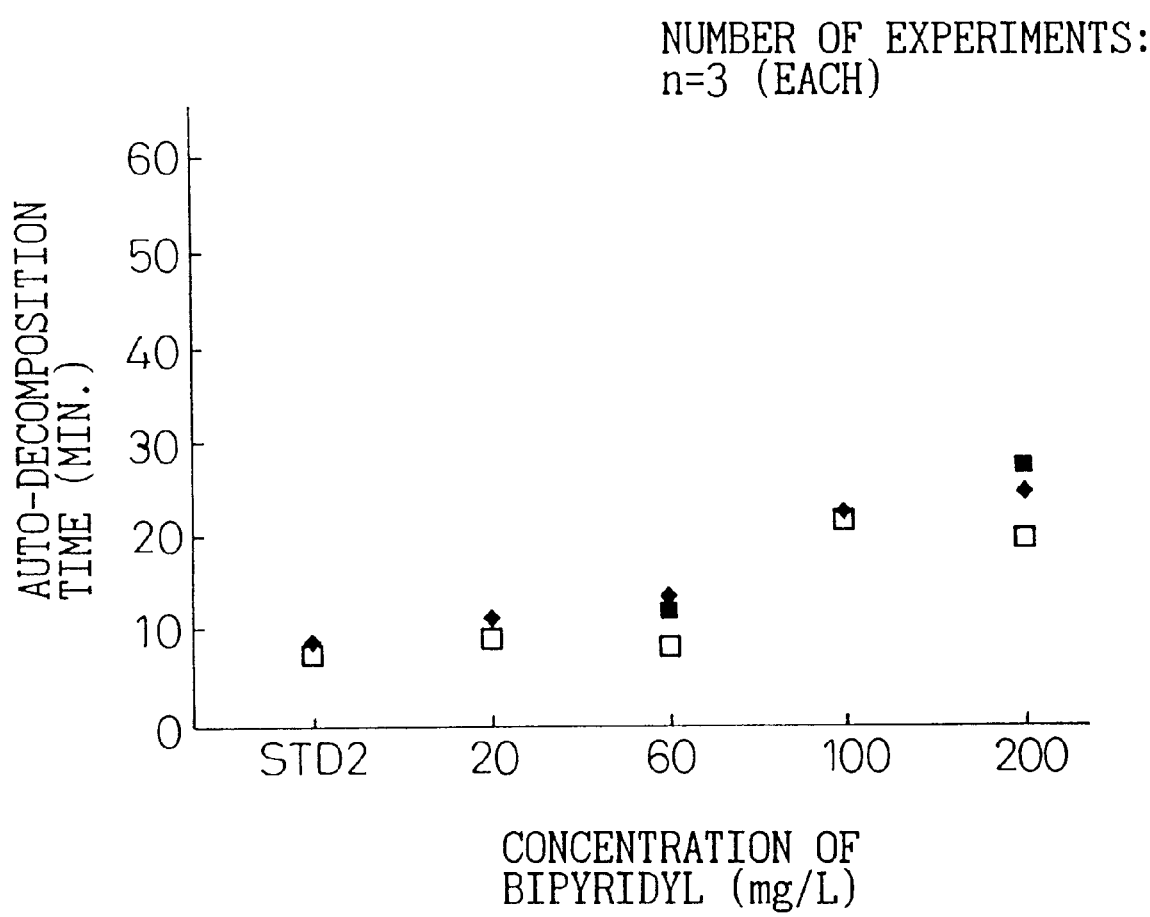
FIG. 5 is a graph showing the relationship between a concentration of bipyridyl and an auto-decomposition starting time of the electroless plating solution in Comparative Example 3, which contains neither potassium ferrocyanide nor anionic surfactant than that of Example 1.

Since it is seen from FIG. 5 that the auto-decomposition starting time of the electroless plating solution is delayed more as the addition amount of bipyridyl is increased more, bipyridyl appears to contribute to the stabilization of the electroless plating solution. However, the auto-decomposition starting time of the electroless plating solution is still short compared with cases where an anionic surfactant and potassium ferrocyanide are added as in Example 1 (see FIG. 1). It is thought from what is described above that bipyridyl cannot stabilize the electroless plating solution sufficiently and consequently cannot be expected to achieve the effect of preventing the formation of nodules.

Comparative Example 4

In the present comparative example, the addition amount of the complexing agent was increased compared with that in Example 1, without adding the anionic surfactant and Fe ions.

That is, to the electroless plating solution (hereinafter referred to "STD2"), the complexing agent was further added in an amount twice or three times as much as that of the complexing agent contained in Example 1.

The same complexing agent as in Example 1, namely disodium citrate was used. Since citric acid may form a complex of nickel ions, it was thought that increasing the addition amount of citric acid would improve the stability of the electroless plating solution.

Figure 6:
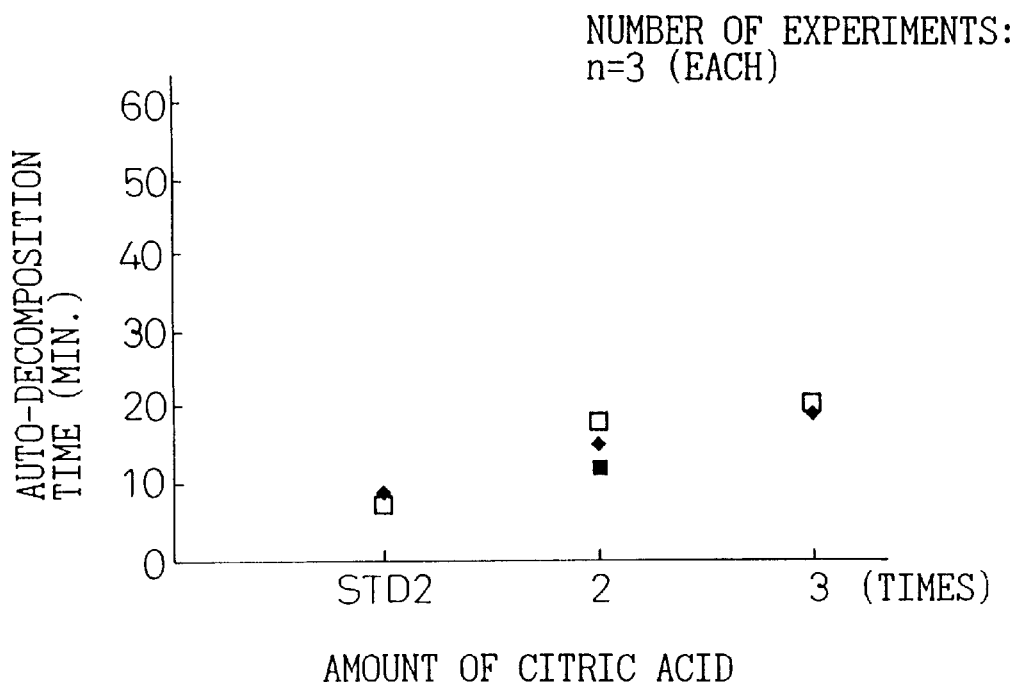
FIG. 6 is a graph showing the relationship between a concentration of citric acid and an auto-decomposition starting time of the electroless plating solution, in Comparative Example 4, which excludes potassium ferrocyanide and an anionic surfactant from the solution of Example 1.

The stability of the electroless plating solution of the present comparative example was evaluated in the same manner as in Example 1, and the results are shown in FIG. 6.

It is understood from FIG. 6 that increasing the addition amount of citric acid hardly delays the auto-decomposition starting time of the electroless plating solution, contrary to expectations, and that the stability of the electroless plating solution was not improved much. Thus, the electroless plating solution of the present comparative example showed considerably deteriorated stability compared with electroless plating solutions to which an anionic surfactant and potassium ferrocyanide had been added as in Example 1.

It can be seen from the results as mentioned above that increasing the addition amount of a complexing agent achieves no substantial effect of stabilizing the electroless plating solution, contrary to expectations.

Similarly, Rochelle salt as a complexing agent did not achieve the effect of stabilizing the electroless plating solution.

Comparative Example 5

In the present comparative example, the anionic surfactant and potassium ferrocyanide were not added, and the pH of the electroless plating solution was varied.

That is, the oxycarboxylic acid used as a complexing agent is basically known to have a higher ability to complexing nickel in an alkaline solution. Accordingly, the pH of the electroless plating solution of STD2, which pH was 10 in Example 1, was changed to 11.0, 12.0 or 12.5.

Figure 7:
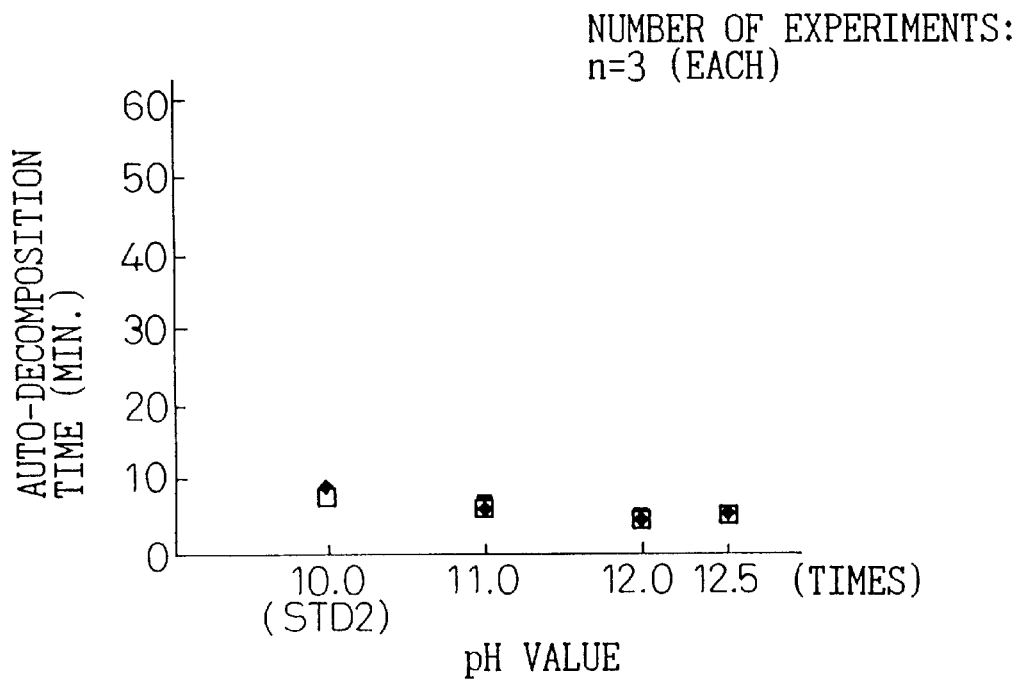
FIG. 7 is a graph showing the relationship between a pH and an auto-decomposition starting time of the electroless plating solution in Comparative Example 5, which excludes potassium ferrocyanide and anionic surfactant from the solution of Example 1.

The stability of the electroless plating solution in the present comparative example was evaluated in the same manner as in Example 1, and the results are shown in FIG. 7.

It can be seen from FIG. 7 that even when the pH of the electroless plating solution was increased, the effect of stabilizing the electroless plating solution was not observed, contrary to the expectations.

Comparative Example 6

In the present comparative example, the anionic surfactant and potassium ferrocyanide were not added, and the concentration of copper sulfate was varied.

That is, the concentration of copper sulfate was changed to twice, three times or five times as much as that of copper sulfate contained in the electroless plating solution STD2.

Figure 8:
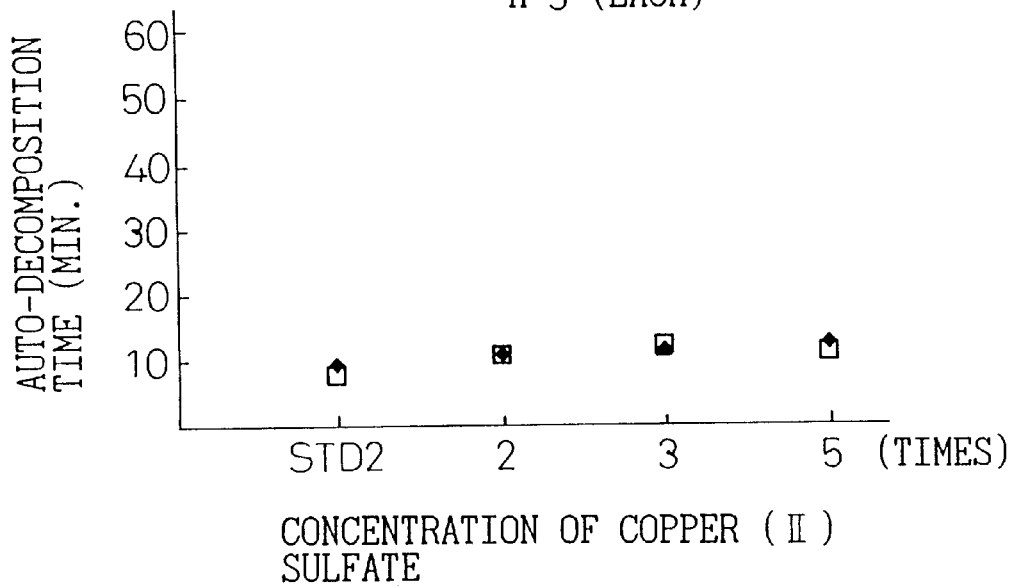
FIG. 8 is an explanatory graph showing the relationship between a concentration of copper(II) sulfate and an auto-decomposition starting time of the electroless plating solution in Comparative Example 6, which excludes potassium ferrocyanide and anionic surfactant from the solution of Example 1.

The stability of the electroless plating solution of the present comparative example was evaluated in the same manner as in Example 1, and the results are shown in FIG. 8.

It can be seen from FIG. 8 that increasing the amount of nickel sulfate caused no substantial change of the stability of the electroless plating solution.

Comparative Example 7

In the present comparative example, the anionic surfactant and potassium ferrocyanide were not added, and the concentration of nickel sulfate was varied.

That is, the concentration of nickel sulfate was changed to 0.5 or 1.5 times as much as that of nickel sulfate contained in the electroless solution of STD2.

Figure 9:
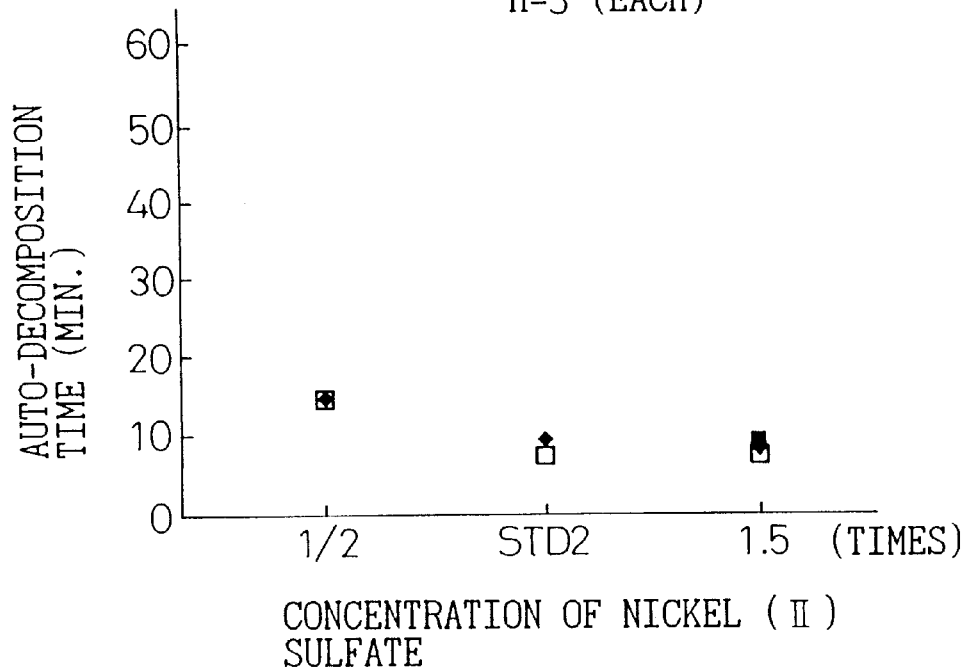
FIG. 9 is a graph showing the relationship between a concentration of nickel(II) sulfate and an auto-decomposition starting time of the electroless plating solution in Comparative Example 7, which excludes potassium ferrocyanide and anionic surfactant from the solution of Example 1.

The stability of the electroless plating solution in the present comparative example was evaluated in the same manner as in Example 1, and the results are shown in FIG. 9.

It is understood from FIG. 9 that increasing the amount of nickel sulfate conversely lowers the stability of the electroless plating solution.

Comparative Example 8

In the present comparative example, the anionic surfactant and potassium ferrocyanide were not added, and the concentration of the reducing agent was varied.

That is, the concentration of the reducing agent was changed to ½, ⅔ or 1.5 times as much as that of the reducing agent in the electroless plating solution of STD2. Sodium hypophosphite was used as a reducing agent as in Example 1.

Figure 10:
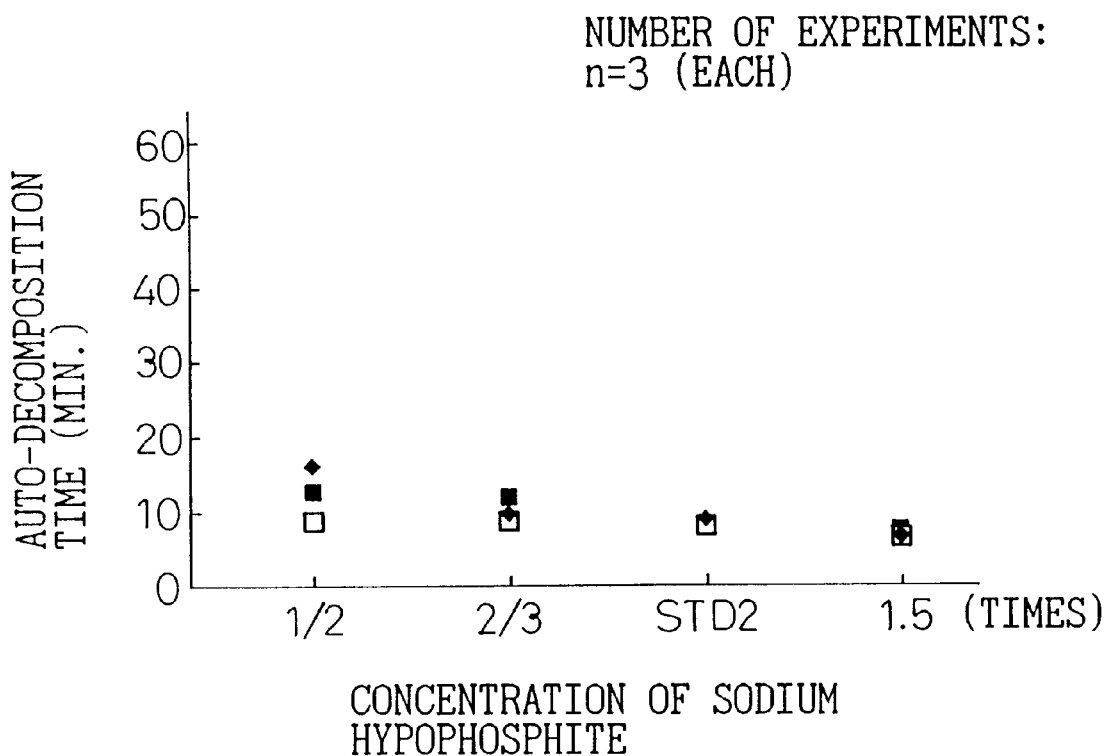
FIG. 10 is an explanatory graph showing the relationship between a concentration of hypophosphorous acid and an auto-decomposition starting time of the electroless plating solution in Comparative Example 8, which excludes potassium ferrocyanide and anionic surfactant from the solution of Example 1.
Figure 11:
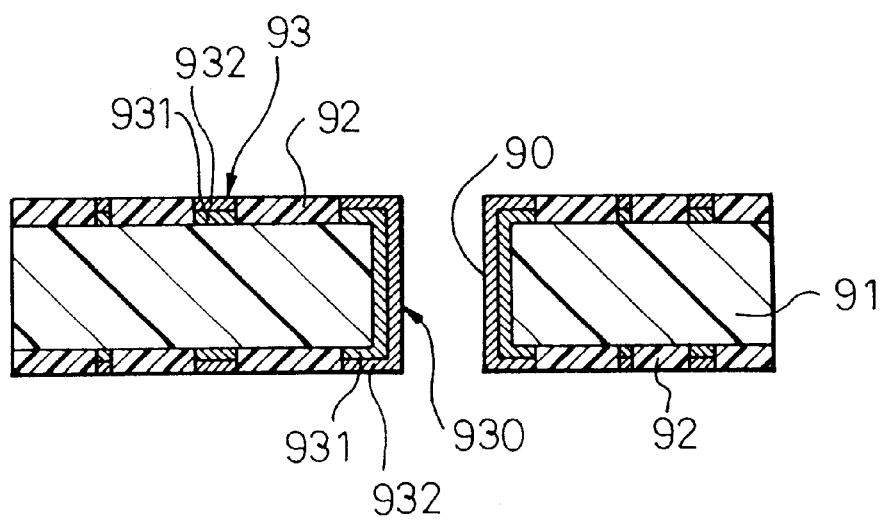
FIG. 11 is an explanatory view showing a method for producing a printed board by the additive procedure in conventional operations.

The stability of the electroless plating solution in the present comparative example was evaluated in the same manner as in Example 1, and the results are shown in FIG. 10.

It can be seen from FIG. 10 that increasing the amount of sodium hypophosphite conversely lowers the stability of the electroless plating solution.

It is understood from Comparative Examples 3 to 8 that when the anionic surfactant and potassium ferrocyanide are not added, increasing or decreasing the other components of the electroless plating solution achieves no stability of the electroless plating solution.

We claim:

1. An electroless plating solution comprising:

metal ions which comprise nickel ions and at least one member selected from the group consisting of copper and cobalt ions;

a complexing agent containing a hydroxycarboxylic acid and a reducing agent and having a pH of at least 7;

iron ions provided by a source selected from the group consisting of potassium ferrocyanide and potassium ferricyanide; and an anionic surfactant.

2. The electroless plating solution according to claim 1, wherein the complexing agent is in a molar amount at least equal to that of the metal ions.

3. The electroless plating solution according to claim 1, wherein the electroless plating solution contains the iron ions in an amount, on the basis of iron metal, of 1 mg/L to 0.2 g/L.

4. The electroless plating solution according to claim 1, wherein the electroless plating solution contains the anionic surfactant in an amount of 10 mg/L to 20 g/L.

* * * * *